Figure 1:
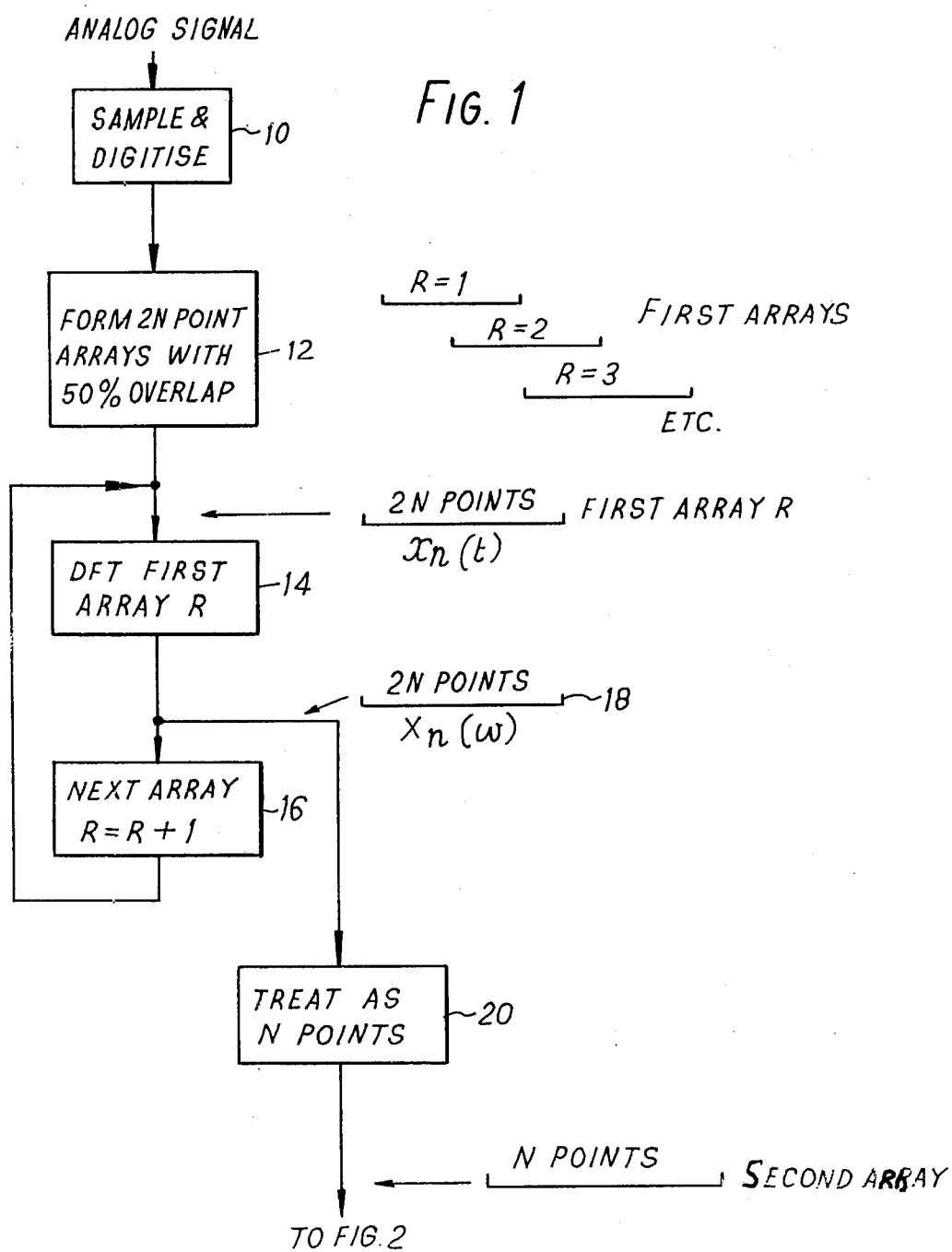

United States Patent [19]
Ley et al.

[11] 4,057,756
[45] Nov. 8, 1977

[54] SIGNAL PROCESSORS

[75] Inventors: Anthony John Ley, New Canaan, Conn.; Eric Metcalf, Ropley; Michael Cedric Jeffery, Aldershot, both of England

[73] Assignee: The Solartron Electronic Group Ltd., Farnborough, England

[21] Appl. No.: 671,883

[22] Filed: Mar. 29, 1976

[30] Foreign Application Priority Data

Apr. 3, 1975 United Kingdom ............... 13767/75

[51] Int. Cl.² .......................................... G01R 23/16
[52] U.S. Cl. ................... 324/77 B; 324/78 D
[58] Field of Search ............... 324/77 B, 77 C, 77 CS, 324/77 R, 78 D, 83 D

*Primary Examiner*—M. Tokar
*Attorney, Agent, or Firm*—William R. Sherman; Kevin McMahon; Martin M. Novack

[57] ABSTRACT

In a spectrum analyzer, the analogue signal to be analyzed is periodically sampled and digitized, and the digit samples are formed into R successive arrays each containing 2N successive samples and each overlapping the previous array by 50%. The forward Fourier transforms of each array are then successively formed, and an array of 2P complex points is formed from the result of each transform, where $L-P/2$ and $L+P/2-1$ are the points which represent the upper and lower limits of a Vernier band to be studied in detail and each array extends from points $L-P$ to $L+P-1$ (i.e. each array is twice the width of the Vernier band, and the Vernier band is symmetrically disposed therein): additionally, each array for which L and R are odd is complemented. The arrays thus formed are then each multiplied by a window function (effectively equivalent to a band pass filter), and the result is subjected to the inverse Fourier transform to form respective further arrays of 2P points. The central points (from $P/2$ to $3P/2-1$) of each of these further arrays are allowed to build up into a continuous array, and the M most recent points, where M is twice the required number of points in the Vernier band, are subjected to the forward Fourier transform to form M complex points, of which the middle points (from $M/4$ to $3M/4-1$) are the desired result.

This analyzer has the advantage that the Vernier band can be digitally positioned anywhere in the frequency band covered by the first forward Fourier transform.

11 Claims, 5 Drawing Figures

SIGNAL PROCESSORS

The present invention relates to signal processors which may be used to perform such functions as filtering a signal or analysis of the frequency spectrum thereof. It is well known that the frequency spectrum of a signal, i.e. a function in the frequency domain, is the Fourier transform of the time domain function. Practical use of this is made in spectrum analysers in which the signal is represented by a set or array of samples taken at a selected sampling frequency. This time domain array is subjected to the discrete Fourier transform (hereinafter denoted by the customary abbreviation DFT) to convert it to a frequency domain array which is the frequency spectrum of the signal from zero frequency up to the Nyguist frequency (half the sampling frequency).

It is also known that filtering in the time domain may be replaced by an equivalent procedure in the frequency domain. Filtering in the time domain is expressed as the convolution of the time domain signal $x(t)$ with the impulse response $h(t)$ of the filter. However, the product of the Fourier transform of $x(t)$, represented as $X(x)$, and of the Fourier transform of $h(t)$, represented as $H(w)$, is itself the Fourier transform of the aforesaid convolution. Therefore, the procedure of filtering in the time domain may be replaced by the procedure of multiplication in the frequency domain, with considerable savings in time for other than very small numbers of samples in the array representing $x(t)$. This array may be written as $x_n(t)$ where the subscript $n$ indicates that the function is represented by the point values, i.e. the samples, taken at $n = 0, 1, 2$, etc. The procedure is therefore to use the DFT to form $X_n(w)$ from $x_n(t)$, to multiply $X_n(w)$ by $H_n(w)$ to form $Y_n(w)$ and then use the DFT to convert $Y_n(w)$ to $y_n(t)$ where $y_n(t)$ is the filtered signal, i.e. the convolution of $x_n(t)$ with $h_n(t)$. For convenience the DFT used to convert from the frequency domain back to the time domain will be referred to as the inverse DFT, abbreviated IDFT, although the actual operation does not differ essentially from the DFT, which abbreviation will hereafter be restricted to meaning the forward transform from the time domain to the frequency domain.

It is also known that the aforesaid multiplication in the frequency domain corresponds to a circular convolution, i.e. the result obtained for $y_n(t)$ is that which would obtain if $x_n(t)$ were periodic with the period of that part of the signal $x(t)$ which is covered by the array $x_n(t)$. In practice this is hardly ever the case and what is required is the aperiodic convolution. This required convolution may be achieved by appending a sufficient number of zeroes to $x_n(t)$ and $h_n(t)$ as is explained in Chapter 7 of Digital Processing of Signals, Gold and Rader, McGraw Hill, 1969. This chapter also explains how it is possible to obtain $y_n(t)$ for a very much larger array $x_n(t)$ than can readily be processed directly in the manner explained above.

Although it is now common practice to use the so-called fast Fourier transform (FFT) to perform DFT's and IDFT'S there remains a constraint on the sizes of the arrays which can be handled economically and/or in a reasonable length of time. The FFT is also explained in the aforesaid book and apparatus for performing the FFT is described in our British patent specification Nos. 1,350,904 and 1,407,401. Typical array sizes which can be used in practice are 512, 1024 and 2048 point values. It may be required, however, to filter $x'(t)$ over a long interval containing a number of samples very much greater than these typical array sizes, using the prime to denote the signal for the long interval. This may be done by a further technique described in Chapter 7 of the aforesaid book wherein $x'_n(t)$ is sectioned into a number of arrays $x_n(t)$, each of suitable size, and from each of which the aperiodic convolution is formed as an array $y_n(t)$ in the manner described, by multiplication in the frequency domain. The arrays $y_n(t)$ may then be appended to each other to build up $y'_n(t)$ for the said long interval. Two alternative but essentially equivalent procedures are described loc.cit and denoted the overlap-save method and overlap-add method.

Although the known techniques described to this point enable filtering to be performed over a long interval, it will be recognized that there never exists a filtered frequency spectrum $Y'_n(w)$ pertaining to the whole of this interval. Filtered frequency spectra $Y_n(w)$ exist only for each individual array $x_n(t)$ formed by the sectioning procedure. However, in the detailed analysis of signals arising in a variety of situations (analysis of servo-systems, electrical networks, optical systems, acoustical problems, and so on) there exists a requirement to study the frequency spectrum of the signal over a restricted and typically narrow band. That is to say it is required to obtain $Y_n(w)$ for the case where $H_n(w)$ pertains to a band pass filter defining the restricted band. If this $Y_n(w)$ can only be obtained for each individual array $x_n(t)$, as is so with the prior art described, $Y_n(w)$ cannot be obtained with high resolution. The spacing of the point values of $Y_n(w)$ will be determined by the sampling frequency divided by the number of point values (samples) in an individual array $x_n(t)$. The number of point values of interest in $Y_n(w)$ will be less than the number of point values in an individual array $x_n(t)$ in proportion as the pass band of the filter is less than the Nyquist band.

The object of the present invention in its broadest aspect is to provide an improved signal processor capable of performing filtering operations, with a concurrent frequency shift, more efficiently than has previously been possible.

A subsidiary object of the invention is to provide a frequency spectrum analyser which is based on the signal processor and is capable of obtaining a high resolution frequency spectrum in a restricted frequency band from a succession of arrays into which a sampled signal is sectioned.

According to the present invention there is provided a signal processor comprising means for repeatedly sampling a signal to form samples, means operative to subject a succession of first, overlapping arrays of the samples to the DFT to form second, frequency domain arrays, means operative to select a restricted third array of contiguous point values from each second array, each of which restricted arrays has a centre value determining the centre frequency of a restricted frequency band, means operative to multiply each restricted third array by a fourth array having the form of a window function and representing the DFT of the impulse response of a band pass filter, thereby to form a fifth array from each third array, means operative to rotate the third or fifth arrays through such phase angles as compensate for array to array shifts of epoch of the first arrays created by the overlap of the first arrays, and means operative to subject the fifth arrays to the IDFT to form sixth time domain arrays of which central groups of point values represent the results of aperiodic convolutions and correspond to frequency components of the sampled signal selected in accordance with the filter pass band corresponding to the window function.

By selecting restricted third arrays, the operations involved in creating the fifth and sixth arrays introduce only a small computational load. The performance of the IDFT on the fifth arrays shifts the selected pass band down to the zero frequency region. That point of the fifth array which is treated first in performing the IDFT becomes zero frequency. If the said point is the first point, the shifted pass band extends from 0 to $f_b$ where the width of the pass band is $f_b$. If the said point is the central point, the shifted pass band extends from $-f_b/2$ to $+f_b/2$.

In order to provide a frequency spectrum analyser, the processor further comprises means operative to append a succession of the said groups to each other to form a seventh array, and means operative to subject the seventh array to the DFT to form an eighth array comprising point values which are the frequency spectrum within the pass band of the filter.

The processor thus enables a high resolution frequency spectrum to be obtained within the pass band of the filter. Even higher resolution can be achieved by using the processor again (or a second processor) to treat a still more restricted pass band, succwssive eighth arrays from the first processing constituting second arrays for the second processing.

According to the invention in another aspect there is provided a signal processor comprising discrete Fourier transforming means and control means constructed and arranged together to operate upon a succession of samples of a signal by a sequence of automatic steps comprising:

a. Forming a succession of overlapping first arrays of the samples;
b. Subjecting each first array to the DFT to form a corresponding second array;
c. Selecting a restricted third array of contiguous values from each second array;
d. Multiplying each third array by a fourth array having the form of a window function, to form a corresponding fifth array;
e. Rotating the third or fifth arrays through such phase angles as compensate for array to array shifts of epoch of the first arrays created by the overlap of the first arrays; and
f. Subjecting each fifth array to the IDFT to form a corresponding sixth array.

Again, the selected pass band is automatically shifted down to the zero frequency region, as explained above.

For effecting frequency spectrum analysis, the sequence of automatic steps further comprises:

g. Appending to each other central groups of point values of a succession of the sixth arrays, to form a seventh array; and
h. Subjecting the seventh array to the DFT to form an eight array.

Before elaborating on the way in which the invention enables the aforestated objects to be met, some explanation will be given of the preferred form of the window function. It is known that a filter cannot be physically realized with infinitely steep flanks; the DFT of the impulse response $h(t)$ of such a filter would have components extending from $-\infty$ to $+\infty$. Equally, it is not possible to use H(w) with infinitely steep flanks. The impulse response would then have components extending from $-\infty$ to $+\infty$. Use of the DFT and IDFT constrains $h(t)$ and H(w) to finite bands and a window function is thus a multiplying function H(w) with non-zero values in a restricted band and zero values outside this band.

It is known to design band pass filters with such properties that both $h(t)$ and H(w) consist of a central region of substantially constant values (e.g. constant within ± 1%) flanked by transition regions falling to zero, flanked in turn by outer regions containing components which are all less than some predetermined tolerance small enough to neglect these components. This tolerance may be $-80$dB, i.e. a factor of $10^{-4}$. The central region is the passband, the transition regions are transition bands and the outer regions are the stop bands. A convenient form of window function is a function H(w) complying with the above constraints but with all values in the central region set exactly equal and all values in the outer regions set to zero. The departure of the window function from H(w) proper introduces no unacceptable perturbations because of the smallness of the aforesaid tolerance. Window functions and techniques for computing them are known per se and reference may again be made to Chapter 7 of the aforesaid book.

Because point values are to be discarded above and below the aforesaid central group of each sixth array, overlap interference or periodic convolution (which is explained in Chapter 7 of the aforesaid book) must arise at both ends of the sixth array instead of just at one end as is the case with the techniques described in the said book. This is achieved by using a window function corresponding to a physically unrealizable, complex, impulse response namely a folded impulse response in which the response of a real band filter with an initial transient becomes a response starting and terminating with mirror symmetrical transients. Although physically unrealizable, there is no problem in representing such a response by the corresponding window function (complex fourth array).

The mode of operation of the invention can now be explained. Since the fourth array is a window function of finite width and since it is necessary to multiply this with only a restricted part of each second array (i.e. with the restricted third array), because one is interested only in a restricted frequency band, each fifth array is an appreciably smaller array than each first array. However, irrespective of where the third array is positioned within the second array, the third array is treated in the multiplication by the fourth array as if a given value $w_o$ were $w = 0$. Each sixth time domain array does not represent a band pass filtered version of the original signal but a filtered version of this signal transformed down in frequency so as to make $w_o$ coincide with zero frequency. As already explained, this value $w_o$ which is made to coincide with zero frequency, may be the first value or the centre value of the restricted third array.

However, the operation to this point performs the function of, for example, recovering the modulation from an amplitude-modulated carrier and the processor may be used for such purpose.

When performing frequency spectrum analysis, only the central groups of points of the sixth arrays are used. Discarding the other points is the discarding of the non-valid points of the circular convolution to leave only the points pertaining to the aperiodic convolution, as explained in Chapter 7 of the aforesaid book. The number of points in each said central group is substantially less than the number of points in each first array and it is, therefore, possible to append a plurality of these groups of points to form a seventh array which, although derived from a like plurality of first arrays, contains only a manageable number of points, such that it is possible economically to perform the DFT and form a band pass filtered frequency spectrum from the plurality of first arrays.

In the eighth array, zero frequency corresponds to $w_o$. The information provided may be used in this frequency-translated form although the amount of the frequency shift can be added to each value in the eighth array to obtain the actual frequency values.

The overlap of the first arrays is preferably 50%. Although other overlaps are possible, the phase angle rotations of the third or fifth arrays are then appreciably more complex to handle than in the case of a 50% overlap when, as will be explained, the rotation amounts only to a conditional negation of arrays.

The processor and analyzer according to the invention can operate in real time or on pre-stored data. For progressive operation, as each new sixth array is formed, its central group of points is appended to the seventh array from which the oldest group of points therein is discarded, the DFT being performed afresh on the seventh array each time it is thus updated.

Although the detailed description of the invention will be given in terms of digital operation, it is also possible to operate on analog samples, techniques for performing all the required operations being available. Thus charge-coupled devices are capable of sampling analog signals at very high rates and then circulating the samples in a manner similar to that employed in digital shift registers. The so-called chirp Z transform is an economical way of performing the DFT (or IDFT) on the circulating analog samples and involves combining the samples with chirp signals, i.e. analog signals whose frequency chirps up or down linearly with time. Surface acoustic wave devices can also be used to implement the chirp Z transform.

The invention has particular utility in the case of analog operation in view of the difficulty of achieving long chirp Z transforms.

An embodiment of the invention will now be described in some detail, by way of example, with reference to the accompanying drawings.

Figure 2:
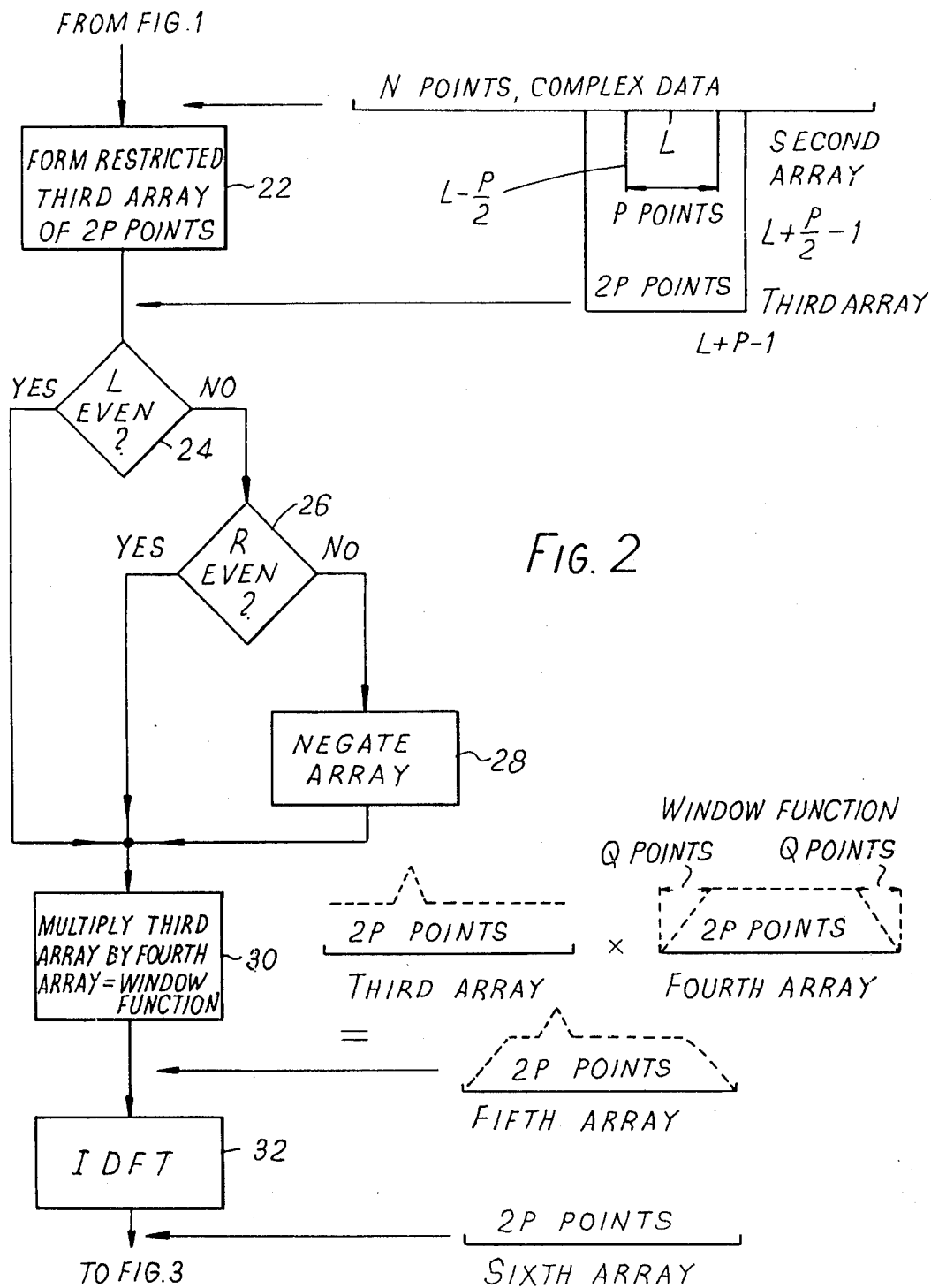
Figure 3:
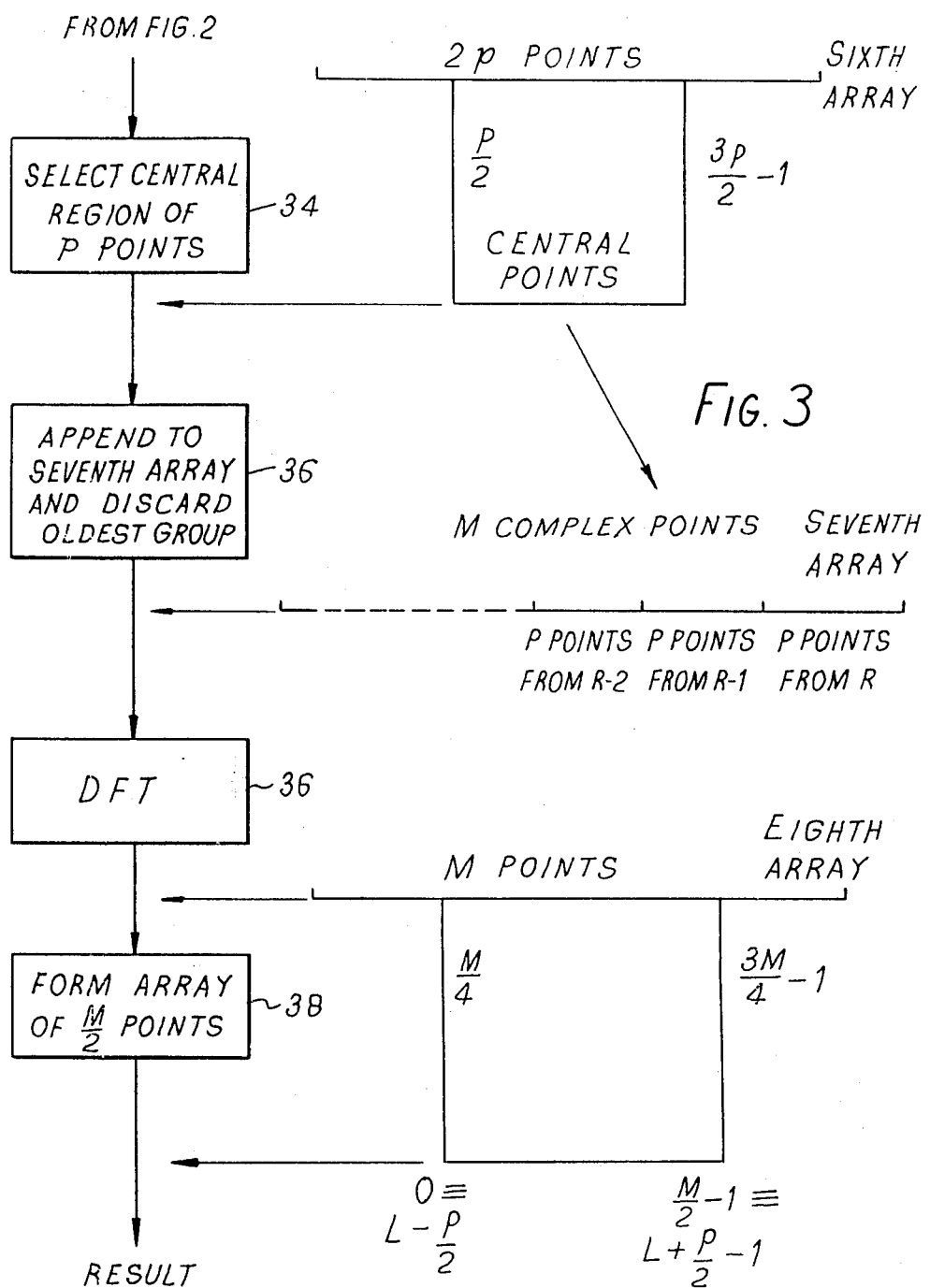
Figure 4:
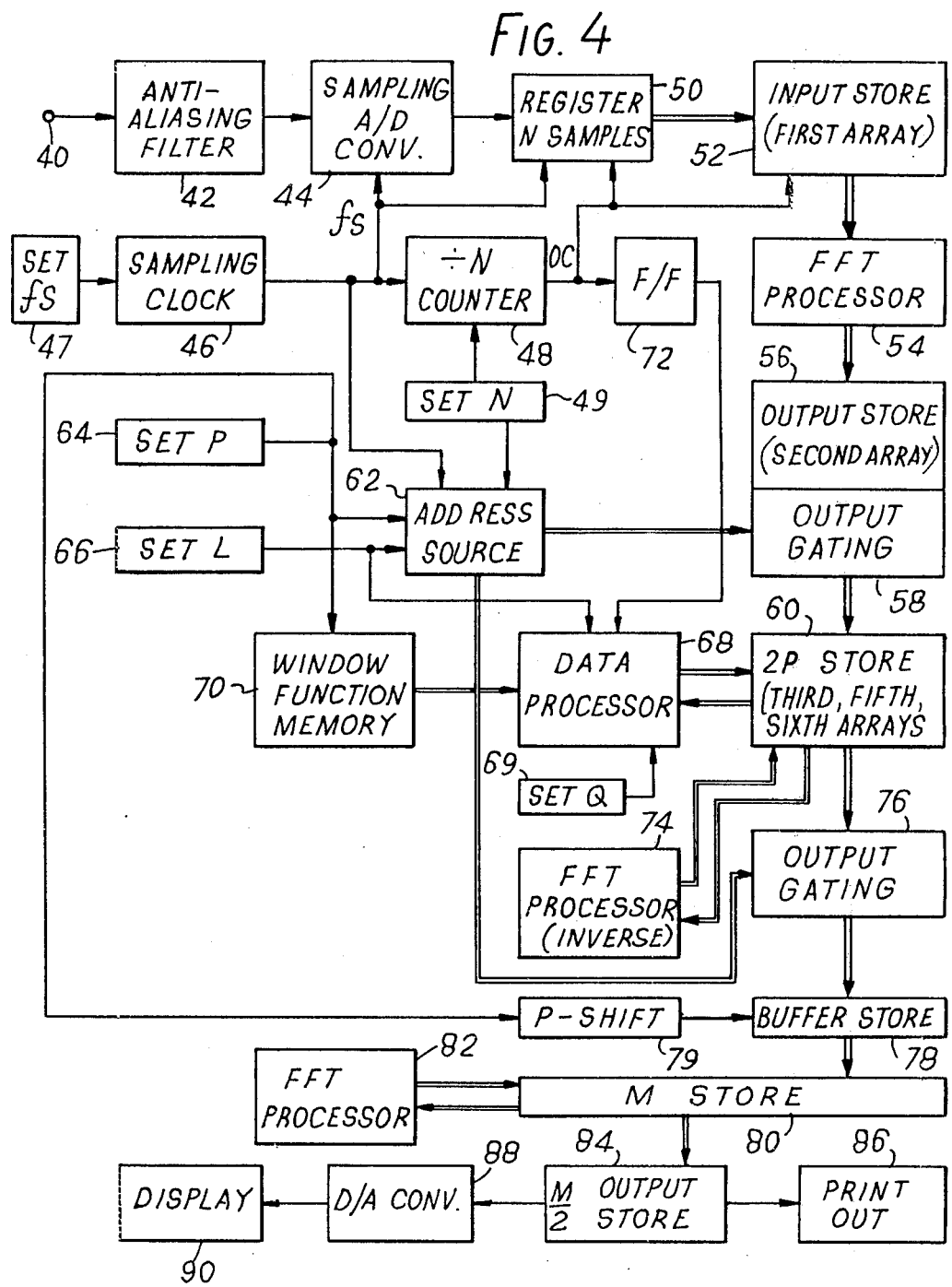
Figure 5:
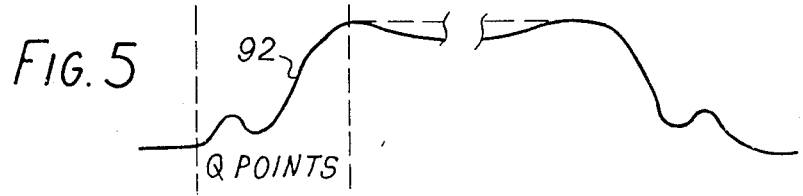

The description will be given firstly in terms of a flow diagram for ease of understanding and then in terms of hardware. In the drawings:

FIGS. 1 to 3 together make up a flow diagram accompanied by diagrams of the arrays used at each stage and labelled first to eighth as in the foregoing paragraphs, FIG. 4 is a block diagram of a complete digital frequency analyzer, and FIG. 5 shows a typical window function.

Referring to FIG. 1 and the reference numerals applied to the blocks thereof, step 10 is entirely conventional; an analog to digital converter is clocked at the sampling frequency to provide a succession of digital samples. These are grouped at 12 in overlapping arrays of 2N points each where 2N may be 1024 for example. The overlap is necessary in order that the segments of the results corresponding to aperiodic convolution may be contiguous in time. A 50% overlap is, as already noted, not essential but it is highly convenient. A 50% overlap arises if the filter impulse response has a length of N points; a shorter impulse response would decrease the overlap and vice versa. However, the shorter the impulse response, the more difficult it is to design the filter and the required form of window function whereas a longer impulse response lengthens the third arrays and reduces efficiency by increasing the computation load.

The DFT (block 14) is performed by known apparatus, e.g. such as is desribed in the aforementioned patent specifications. Each first array is treated in turn (block 16) within an operating cycle of duration $N/f_s$ where $f_s$ is the sampling frequency, if operating in real time. The result of the DFT is an array 18 which exhibits complex conjugate symmetry about the Nyquist frequency, if using real data. The second half of the array 18 of 2N complex points may, therefore, be discarded without loss of information, retaining N complex points. The result of the DFT is treated as a second array of N points, as symbolized by block 20.

Turning to FIG. 2, block 22, a restricted third array is formed centred on an angular frequency $w_o$ which is point L in the second array. The third array consists of a central P points corresponding to the restricted frequency band which it is desired to analyse in detail, flanked by further points which, in the example given, make the total width of the third array equal to 2P points. P may be odd, in which case point L is the central one of the P points, or P may be even, in which case point L is a known one of the two central points in the P points. By way of example it is assumed in FIG. 2 that P is even and that point L is the upper one of the two central points. It is also here assumed, purely by way of example, that the central region of the window function contains 2P-2Q points and that both its flanks (transition regions) have a width of Q points, giving a total width of 2P points, which is the width of the third array but the width of the central region would have to be adjusted if the flanks of the window function had a different width. The central region is expanded or contacted as required to make the total width of the window function the same as that of the third array.

Blocks 24, 26 and 28 will be seen to negate the third aray (as to both the real and imaginary parts of each value) if both L and R are odd where the first arrays are numbered R = 1, 2, 3, etc. in succession. The need for this arises in that, if L is odd, the first arrays are shifted through $\pi$ radians from array to array because of the 50% overlap. The conditional negation corrects for this. It is a significant advantage of the 50% overlap that the conditional negation is all that is required. For any other overlap more complex conditional rotations of phase angle would be required.

The third arrays, now with correct epochs are multiplied in turn, on a point-by-point basis, by the window function constituting the fourth array (block 30) to form the fifth arrays. This is illustrated schematically by the dotted line functions in FIG. 2, the dotting symbolizing the fact that each function is an array of 2P points. Each fifth array is subjected to the IDFT (block 32) to form a sixth array, a known FFT apparatus again being used, the same apparatus as in block 14 if speed considerations allow.

The conditional negation (blocks 24, 26 and 28) could equally well be performed after the multiplication (block 30).

Continuing to FIG. 3, a central region of the sixth array is selected (block 34) this being the central P points for the case of 50% overlap of the first arrays. The discarded outer points are the non-valid part of the circular convolution and the selected points are those of the aperiodic convolution. The selected P points are appended to the seventh array (block 36) and the oldest P points are discarded to maintain M complex points in the array. For the selected window function, it is convenient to make M twice the number of complex points required in the restricted band being analysed.

The seventh array is subjected to the DFT (block 36) to form the eighth array, of which the central M/2 points, selected at block 38, are the required result, i.e. a high resolution frequency spectrum in the band of width P and centred on $L \equiv w_o$.

The selection of only M/2 points is not essential. M complex points will yield M spectral lines, all theoretically usable. The middle points are usable as they stand but the first and last points effectively have the flask of the window function superimposed thereon and to use these points they would have to be inversely weighted by the corresponding points of the flanks of the window function. The number of points at each end requiring inverse weighting is Q/2P. M. It is more convenient to discard at least these points.

FIG. 4 is a schematic block diagram of an analyser embodying the invention and which performs the operations described with reference to FIGS. 1 to 3.

The analog input signal applied to terminal 40 is filtered by an anti-aliasing, low-pass filter 42 which removes any components with a frequency greater than half the sampling frequency $f_s$, this being a known requirement whenever a signal is to be converted to a succession of samples. The filtered signal is applied to a sampling analog to digital converter 44 of known form which is controlled by a sampling frequency clock 46 (adjustable by a thumbwheel switch 47) and provides a fresh digital sample in response to each clock pulse. The operating cycle of the apparatus is of duration $N/f_s$ and a divide-by-N counter 48 counts down the clock pulses to produce operating cycle pulses OC which time the operations of the subsequent stages of the apparatus. A thumbwheel switch 49 can be used to set the required value of N.

The samples are clocked into an N-stage register 50 which can be a multilevel shift register with one level for each bit value of the digital samples. The register 50 fills up with N samples which are then rapidly transferred, e.g. in parallel, to the first half of an input store 52 in response to the pulse OC, thereby emptying the register 50 to receive the next N samples. Simultaneously the contents of the first half of the store 52 are transferred to the second half of the store, thereby converting the contents of this store from the $(R-1)^{th}$ first array to the $R^{th}$ first array. An FFT processor 54 performs the DFT on the contents of the store 52 and enters the result (the second array) in an output store 56. The FFT processor and its input and output stores can be constructed in accordance with the aforementioned patent specifications and, if necessary to achieve the required speed of operation, may be duplicated so that odd first arrays are handled by one processor while even arrays are handled by a second processor.

The output store 56 is provided with addressable output gating 58 for selecting the required 2P points which are to form the third array, the selected points being gated out to a further store 60. The addresses of the 2P points are provided by an address source 62 which is preferably programmable under the control of two manually presettable devices 64 and 66. The device 64 sets up the required value of P, thereby determining the width of the pass band to be analysed in accordance with the values of $f_s$ and N. The device 66 sets up the required value of L, thereby similarly determining the centre frequency of the pass band. These two devices may be thumbwheel switches calibrated in Hertz and which produce digital signals representing P and L.

The address source 62 is a simple data processor which is fed with the clock pulses and also the value N and counts cyclically one to N and determines the numbers in this sequence which correspond to $L - (P/2)$ and $L + (P/2) - 1$ by simple arithmetic. For the numbers lying between these values inclusive, signals are emitted to open the corresponding gates in the output gating 58.

The contents of the store 60, initially the third array, are read in and out of this store to be subjected to the conditional negation, multiplication by the window function and then performance of the IDFT which finally leaves the sixth array in the store 60. The conditional negation and multiplication are simple operations which can be performed by purpose-built circuitry but which are very readily performed by a suitably programmed small data processor 68. The window function is held in a ROM 70 which only has to store the Q values defining one flank since the other flank is the mirror image thereof and the intervening values are assumed to be constant (and of value unity).

FIG. 5 shows a typical window function in solid lines. For optimum functioning, different window functions can be computed for each different value of P (width of pass-band) with the corresponding Q values defining the flank thereof stored in different regions of the ROM. The region to be used is addressed by the value of P supplied by the device 64. Below the flank 92 shown in FIG. 5, the function is taken to be zero. Above the flank, in the central region, the function is taken to have the constant value of unity as is denoted by the broken horizontal line. For more accurate operation it would be possible to extend the ROM capacity to store the correct values in the central region for use by the processor 68.

The processor 68 multiplies the contents of store 60 by the contents of the ROM 70, on a point-by-point basis and returns the result to the store 60. Assuming the simple case of just Q points stored in the ROM 70 (or the region thereof addressed by P), these can be called points MER 1 to MER Q. The processor treats points MAND 1 to MAND 2P of the array in the store 60, MER and MAND denoting multiplier and multiplicand respectively. When processing points MAND 1 to MAND Q, the processor calls up points MER 1 to MER Q respectively from the ROM 70 and forms the corresponding products. When processing points MAND(2P − Q − 1) to MAND 2P, the processor calls up points MER Q to MER 1 respectively (note the reverse order) and forms the corresponding products. The intervening points MAND(Q + 1) to MAND(2P − Q) are un-multiplied when the central region of the window function is assumed constant, with value unity. To enable the processor to address the ROM correctly, the value of Q is supplied to the processor by a thumbwheel switch 69.

Either before or after the multiplication the processor 68 determines if L and R are both odd and if so rewrites the contents of store 60 therein after negation. The processor receives the value of L from the device 66 and a signal indicating whether R is odd or even from a bistable flip-flop 72 driven by the pulse OC.

The multiplied and conditionally negated fifth array now in store 60 is next read out and rewritten therein as the sixth array by another FFT processor 74 performing the IDFT. Only the central P points of the sixth array are now read out of the store 60 through output gating 76. This gating is addressed by the address source 62 in accordane with the value of P.

The P points read out from the store 60 are written into the first part of an M-point buffer store 78. The existing contents of the store 78 are shifted along the store 78 so as to clear the said first part for reception of the P new points and shift out the oldest P points. This shift is effected by a shift control device 79 which receives the value of P from the device 64. When the first part of the store 78 has thus been cleared, the contents of the store 60 are transferred thereto to form the new array of M points. This array is transformed to a store 80. The contents of the store 80 are now subjected to the DFT by another FFT processor 82 and returned to the store 80. The central M/2 points of the store 80 are transferred to an output store 84 which contains the required frequency spectrum as a series of point values, M/2 being taken, as in the description of FIG. 3, as a simple example even although more points than this are usable. These values may be fed to a printer 86 which prints out the spectrum and/or on a continuous refresh basis to a digital-to-analog converter 88 which supplies an analog signal to a display device 90 on which the spectral pattern is displayed.

It may be desired to analyse the frequency spectrum in more than one pass band. To this end the whole of FIG. 4 from block 58 onwards may be replicated to provide a separate processing channel for each pass band.

All the operations in FIG. 4 are controlled by the pulse OC establishing the operation cycle although connections to the various blocks have not been shown as they would merely confuse the drawing. It will be understood that the operations are timed to follow each other in correct sequence as is well known in digital processing apparatus and that, although every operation will take place once per cycle, there may be an overlapping succession of the operations. Typically, however, data from any one first array will enter into the result in the store 84 after one operating cycle has elapsed.

In order to explain the invention clearly, FIG. 4 shows a plurality of blocks assigned to different functions. It will be understood that the analyser need not be built up in this way but that it could be integrated into a single, fast data processor programmed to perform all the required computations in a predetermined sequence.

What is claimed is:

1. A signal processor comprising means for repeatedly sampling an input signal to form samples, means operative to subject a succession of first, overlapping arrays of the samples to a Discrete Fourier Transform operation to form second, frequency domain arrays, means operative to select from each second array a restricted third array of contiguous point values including a centre value at the centre frequency of a predetermined restricted frequency band, means operative to multiply each restricted third array by a fourth array havng the form of a predetermined window function and representing the Discrete Fourier Trandformation of the impulse response of a band pass filter, thereby to form a fifth array from each third array, means operative to rotate a selected one of the third and fifth arrays through such phase angles as compensate for array to array shifts of epoch of the first arrays created by the overlap of the first arrays, and means operative to subject the fifth arrays to an Inverse Discrete Fourier Transform operation to form sixth time domain arrays of which central groups of point values are sequential samples of a time-domain signal equivalent to a frequency-shifted result of an aperiodic convolution of said input signal with said impulse response of said band pass filter.

2. A signal processor according to claim 1, wherein the succession of first overlapping arrays have a 50% overlap and the means operative to rotate the selected one of the third and fifth arrays perform a conditional negative thereof.

3. A signal processor according to claim 1, wherein the multiplying means provide the fourth array as a window function consisting of a central region flanked by two transition regions flanked in turn by two outer regions, the central region consisting of equal non-zero values, the outer regions consisting of only zero values, and the transition regions consisting of values in between zero an the values of the central region.

4. A frequency spectrum analyser comprising means for repeatedly sampling a signal to form samples, means operative to subject a succession of first, overlapping arrays of the samples to a Discrete Fourier Transform operation to form second, frequency domain arrays, means operative to select from each second array a restricted third array of contiguous point values including a centre value at the centre frequency of a predetermined restricted frequency band, means operative to multiply each restricted third array by a fourth array having the form of a predetermined window function and representing Discrete Fourier Transformation of the impulse response of a band pass filter, thereby to form a fifth array from each third array, means operative to rotate a selected one of the third and fifth arrays through such phase angles as compensate for array to array shifts of epoch of the first arrays created by the overlap of the first arrays, means operative to subject the fifth arrays to an Inverse Discrete Fourier Transform operation to form sixth time domain arrays of which central groups of point values represent a frequency-shifted result of an aperiodic convolution of said sampled signal with said impulse response of said band pass filter, means operative to append a succession of the said groups to each other to form a seventh array, and means operative to subject the seventh array to a Discrete Fourier Transform operation to form an eighth array comprising point values which are the frequency spectrum of said signal within the pass band of the filter.

5. A signal processor comprising discrete Fourier transforming means and control means constructed and arranged together to operate upon a succession of samples of an input signal by a sequence of automatic steps comprising:
a forming a succesion of overlapping first arrays of the samples;
b. subjecting each first array to a Discrete Fourier Transform operation to form a corresponding second array;
c. selecting a restricted third array of contiguous values from each second array;
d. multiplying each third array by a fourth array having the form of a window function, to form a corresponding fifth array;

e. rotating the third or fifth arrays through such phase angles as compensate for array to array shifts of epoch of the first arrays created by the overlap of the first arrays; and
f. subjecting each fifth array to an Inverse Discrete Fourier Transform operation to form a corresponding sixth array;

whereby a central group of point values of each said sixth array comprises sequential samples of a time-domain signal equivalent to said input signal after filtering and frequency-shifting thereof.

6. A signal processor according to claim 5, wherein the first arrays of the samples have 50% overlap.

7. A signal processor according to claim 6, wherein the rotation of step (e) is performed by conditional negation of a selected one of the third and fifth arrays.

8. A signal processor according to claim 7, wherein the overlapping first arrays each include 2N points, where N is an integer and overlap N points of the preceding first array, each second array includes N complex points, each third array consists of 2P points of a second array, where P is an integer, centred on the $L^{th}$ point of the second array, the fourth array consists of 2P points of which a central 2P-2Q points, where Q is an integer, have equal values and are flanked on either side by Q points falling to zero, and the third or fifth arrays aree conditionally negated depending upon whether the product of L and R is odd or even and R is the number of the first array in the said succession of first arrays.

9. A frequency spectrum analyzer comprising discrete Fourier transforming means and control means constructed and arranged together to operate upon a succession of samples of a signal by a sequence of automatic steps comprising:
a. forming a succession of overlapping first arrays of the samples;
b. subjecting each first array to a Discrete Fourier Transform operation to form a corresponding second array;
c. selecting a restricted third array of contiguous values from each second array;
d. multiplying each third array by a fourth array having the form of a window function, to form a corresponding fifth array;
e. rotating the third or fifth arrays through such phase angles as compensate for array to array shifts of epoch of the first arrays created by the overlap of the first array;
f. subjecting each fifth array to an Inverse Discrete Fourier Transform operation to form a corresponding sixth array;
g. appending to each other central groups of point values of a succession of the sixth arrays, to form a seventh array; and
h. subjecting the seventh array to a Discrete Fourier Transform operation to form an eighth array;

whereby said eighth array comprises point values which are the frequency spectrum of said signal after filtering thereof.

10. A frequency spectrum analyzer according to claim 9, wherein the overlapping first arrays each include 2N points, where N is an integer and overlap N points of the preceding first array, each second array includes N complex points, each third array consists of 2P points of a second array, where P is an integer, centred on the $L^{th}$ point of the second array, the fourth array consists of 2P points of which a central 2P-2Q points, where Q is an integer, have equal values and are flanked on either side by Q points falling to zero, and the third or fifth arrays are conditionally negated depending upon whether the product of L and R is odd or even and R is the number of the first array in the said succession of first arrays.

11. A frequency spectrum analyzer according to claim 10, wherein each central group of points of a sixth array includes P points.

* * * * *